United States Patent
Yoshikawa

(12) 
(10) Patent No.: US 6,251,709 B1
(45) Date of Patent: Jun. 26, 2001

(54) METHOD OF MANUFACTURING A COOLING STRUCTURE OF A MULTICHIP MODULE

(75) Inventor: Minoru Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/498,014

(22) Filed: Feb. 4, 2000

Related U.S. Application Data

(62) Division of application No. 09/105,251, filed on Jun. 26, 1998, now Pat. No. 6,046,498.

(51) Int. Cl.[7] ............... H01L 21/44; H01L 21/48; H01L 21/50
(52) U.S. Cl. ............... 438/123; 438/108; 438/121
(58) Field of Search .................................. 438/123, 121, 438/118, 110, 108, 107, 106

(56) References Cited

U.S. PATENT DOCUMENTS

| | | |
|---|---|---|
| 4,612,601 | 9/1986 | Watari . |
| 4,765,400 | 8/1988 | Chu et al. . |
| 4,908,695 | 3/1990 | Morihara et al. . |
| 5,256,902 | 10/1993 | Culver . |
| 5,696,031 | * 12/1997 | Wark . |
| 5,705,850 | 1/1998 | Ashiwake et al. . |
| 5,819,402 | 10/1998 | Edwards et al. . |
| 5,844,311 | * 12/1998 | Watanabe et al. . |

FOREIGN PATENT DOCUMENTS

| | | |
|---|---|---|
| 59-65458 | 4/1984 | (JP) . |
| 61-15353 | 1/1986 | (JP) . |
| 62-118550 | 5/1987 | (JP) . |
| 62-131550 | 6/1987 | (JP) . |
| 62-59887 | 12/1987 | (JP) . |
| 63-141355 | 6/1988 | (JP) . |
| 63-250848 | 10/1988 | (JP) . |
| 1-217951 | 8/1989 | (JP) . |
| 1-286348 | 11/1989 | (JP) . |
| 2-7456 | 1/1990 | (JP) . |
| 2-83954 | 3/1990 | (JP) . |
| 3-35832 | 5/1991 | (JP) . |
| 4-262562 | 9/1992 | (JP) . |
| 7-38020 | 2/1995 | (JP) . |

* cited by examiner

*Primary Examiner*—Kevin M. Picardat
*Assistant Examiner*—D. B. Collins
(74) *Attorney, Agent, or Firm*—Sughrue, Mion, Zinn, Macpeak & Seas, PLLC

(57) ABSTRACT

A cooling structure is provided for a multichip module on which integrated circuit devices (i.e., LSI devices) having heat-radiation surfaces are mounted, wherein there are provided a heat sink, thermal conduction blocks and thermal compounds. Recess portions are formed at a surface of the heat sink in connection with the integrated circuit devices of the multichip module. Low melting point metal material such as solder is supplied to interiors of the recess portions of the heat sink. The thermal conduction blocks are partially inserted into the interiors of the recess portions under the condition where the low melting point metal material is heated and melted, so that the thermal conduction blocks temporarily float in the melted material. To avoid heat transfer toward the integrated circuit devices, a heat insulating sheet is provided on the thermal conduction blocks. Then, the low melting point metal material is solidified, so the heat insulating sheet is removed. The thermal compounds are placed on the thermal conduction blocks. Thus, the integrated circuit devices and the thermal conduction blocks are connected together by means of the thermal compounds. Because of temporarily floating of the thermal conduction blocks in the melted material, it is possible to absorb dispersion in heights and slopes of the heat-radiation surfaces of the integrated circuit devices.

3 Claims, 7 Drawing Sheets

METHOD OF MANUFACTURING A COOLING STRUCTURE OF A MULTICHIP MODULE

This is a divisional of application Ser. No. 09/105,251 filed Jun. 26, 1998, the disclosure of which is incorporated herein by reference now U.S. Pat. No. 6,046,498.

BACKGROUND OF THE INVENTION

1. Field of the Invention

This invention relates to cooling structures that cool down integrated circuit devices mounted on multichip modules by using heat sinks as well as methods of manufacturing those structures. This application is based on patent application No. Hei 9-174143 filed in Japan, the content of which is incorporated herein by reference.

2. Description of the Related Art

According to the conventional cooling structure of the multichip module, heat-radiation surfaces of devices of LSI (an abbreviation for "Large Scale Integration") mounted on a board of the multichip module are forced to come in contact with a single heat sink. Thus, it is possible to radiate heat from each of the LSI devices. In some cases, however, the LSI devices differ from each other in standards. Or, even if all of the LSI devices are manufactured in the same standard, the LSI devices differ from each other due to manufacture error, which occurs when they are mounted on the board, or due to a bend of the board and the like. In that case, uniform mount height cannot be secured for all of the LSI devices, whose mount heights may disperse. For this reason, the LSI devices may have different slopes in upper surfaces thereof. The dispersion in mount heights of the LSI devices may frequently reach 0.5 mm or so. The dispersion in mount heights and slopes of the LSI devices may cause dispersion in heat-radiation surfaces and slopes of the LSI devices. So, there exist LSI devices whose heat-radiation surfaces cannot come in contact with the heat sink. As a result, there occurs a problem that those LSI devices cannot radiate heat.

To solve the above problem, a heat-transfer sheet having flexibility is provided in a gap between the heat-radiation surface of the LSI device and a lower surface of the heat sink so as to absorb (or cancel) dispersion in heights and slopes of the heat-radiation surfaces. Such a technique will be called "prior art 1".

The paper of Japanese Patent Publication No. Sho 62-59887 discloses another technique (called "prior art 2") that provides bond having good thermal conduction in a gap between the heat-radiation surface of the LSI device and the lower surface of the heat sink so as to absorb dispersion in heights and slopes of the heat-radiation surfaces.

However, the prior arts 1 and 2 have a problem because they cannot be applied to the case where the LSI devices mounted on the multichip module have great heating values.

The aforementioned heat-transfer sheet and thermal conductive bond, used by the prior arts 1 and 2, contain thermal conductive particles such as alumina-filler. In order to achieve heat radiation of the LSI device having a great heating value, a number of the thermal conductive particles is increased to increase thermal conductivity. In that case, however, flexibility could be damaged in the heat-transfer sheet and the thermal conductive bond before hardening, because, the density of the thermal conductive particles is increased. If the flexibility is damaged, it should be necessary to impart excessive stress to the heat-radiation surfaces to absorb dispersion in mount heights of the heat-radiation surfaces. That is, sufficient flexibility should be required for the heat-transfer sheet and the thermal conductive bond before hardening. For this reason, it is difficult to increase the number of the thermal conductive particles. So, there is a limit in thermal conductivity, which corresponds to 1 W/m·K or so. As described above, the heat-transfer sheet and thermal conductive bond of the prior arts 1 and 2 cannot reduce thermal resistance.

SUMMARY OF THE INVENTION

It is an object of the invention to provide a cooling structure that provides improvements in thermal conductivity from heat-radiation surfaces of LSI devices, mounted on a multichip module, to a single heat sink.

It is another object of the invention to provide a cooling structure that can absorb (or cancel) dispersion in heights and slopes of LSI chips with respect to a heat sink.

It is a further object of the invention to provide a method of manufacturing the above cooling structure of the multichip module.

According to a cooling structure of this invention provided for a multichip module on which integrated circuit devices (i.e., LSI devices) having heat-radiation surfaces are mounted, there are provided a heat sink, thermal conduction blocks and thermal compounds. Recess portions are formed at a surface of the heat sink in connection with the integrated circuit devices of the multichip module. Low melting point metal material such as solder is supplied to interiors of the recess portions of the heat sink. The thermal conduction blocks are partially inserted into the interiors of the recess portions under the condition where the low melting point metal material is heated and melted, so that the thermal conduction blocks temporarily float in the melted material. Herein, the thermal conduction blocks are made of material which is smaller in specific gravity than the low melting point metal material. To avoid heat transfer toward the LSI devices, a heat insulating sheet is provided on the thermal conduction blocks.

Then, the low melting point metal material is solidified, so the heat insulating sheet is removed. The thermal compounds are placed on the thermal conduction blocks, wherein the thermal compounds are made of silicon oil mixed with alumina-filler, for example. Thus, the integrated circuit devices and the thermal conduction blocks are connected together by means of the thermal compounds.

Because of temporary floating of the thermal conduction blocks in the melted material, it is possible to absorb dispersion in heights and slopes of the heat-radiation surfaces of the integrated circuit devices.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENT

Now, examples of this invention will be described with reference to the drawings, wherein corresponding parts are designated by the same numerals.

Figure 1:
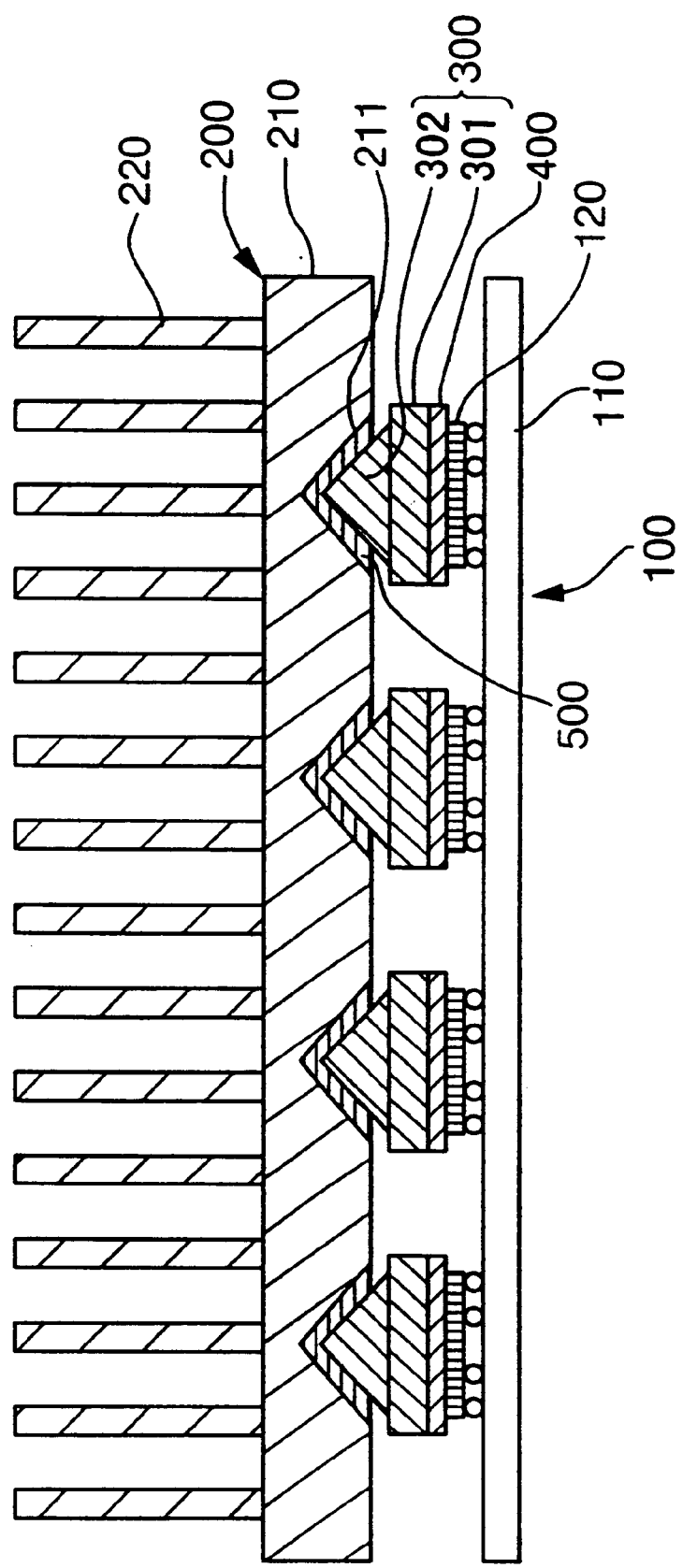
FIG. 1 is a sectional view showing a cooling structure of a multichip module in accordance with a first example of the invention.

FIG. 1 shows a cooling structure of a multichip module in accordance with a first example of the invention. Herein, the cooling structure contains a multichip module 100, a heat sink 200 and thermal conduction blocks 300.

The multichip module 100 contains a board 110 and LSI devices 120. The board 110 is constructed by a ceramic board, a printed-circuit board or else. The multiple LSI devices 120 are mounted on an upper surface of the board 110. Herein, each of the LSI devices 120 is mounted in a face-down manner. A heat-radiation surface of the LSI device 120 is not turned to face with a mount surface of the board 110. The LSI devices 120 and the board 110 are connected together electrically and mechanically by solder balls.

Each of the LSI device 120 has a different standard in external form and thickness. Alternatively, the LSI devices 120 that are manufactured in the same standard differ from each other in heights and slopes due to manufacture error that occurs when they are mounted on the board and/or a bend of the board 110.

Thermal conduction blocks 300 are respectively provided for heat-radiation surfaces of the LSI devices 120. Herein, the thermal conduction blocks 300 are made of metal materials having good thermal conductivity, preferably, aluminum alloy or copper. Each of the thermal conduction blocks 300 contains a flat plate portion 301 and a conic portion 302. The flat plate portion 301 is shaped like a flat plate, an external form of which is identical to or similar to an external form of the LSI device 120. The conic portion 302 is provided upon the flat plate portion 301, wherein a bottom surface of the conic portion 302 is placed in contact with an upper surface of the flat plate portion 301.

A pair of the LSI device 120 and the thermal conduction block 300 are connected together by thermal compound 400. The thermal compound 400 is made by mixing particles of small diameters having good thermal conductivity with silicon oil. The particles are made by metal oxide such as alumina-filler, for example. The thermal compound 400 is filled in a gap, which is formed between the LSI device 120 and the thermal conduction block 300 and whose size is several tens of micro meters or so. The thermal compound 400 is provided to absorb (or cancel) a difference between coefficients of thermal expansion of the LSI device 120 and the thermal conduction block 300. Because, the coefficient of thermal expansion of the LSI device 120 differs from that of the thermal conduction block 300 by a multiplication factor of five to six or so. The thermal compound 400 is superior in fluidity, so it can be compressed without substantially imparting force (or load) thereto.

The heat sink 200 is provided upon the multiple thermal conduction blocks 300. The heat sink 200 contains a base portion 210 and multiple fins 220.

The base portion 210 provides multiple recess portions 211. The recess portions 211 are formed to partially cut a lower portion of the base portion 210. The recess portions 211 are located at positions that correspond to the thermal conduction blocks 300 respectively. So, pairs of the recess portions 211 and the thermal conduction blocks 300 provide an optimum thermal conduction path, which is not always affected by variation in heights and slopes of the heat-radiation surfaces of the LSI device 120, between the LSI devices 120 and the heat sink 200. The recess portions 211 are formed to have shapes that follow variations of the heat-radiation surfaces of the LSI devices 120, wherein their shapes are changeable in heights and slopes. To cope with the conic portion 302 of the thermal conduction block 300, an interior of the recess portion 211 is formed to have a conic-surface-like shape.

The conic portion 302 of the thermal conduction block 300 and the recess portion 211 of the heat sink 200 are connected together by solder 500. Using a property of the solder 500 whose melting point is lower than that of the thermal conduction block 300, the thermal conduction block 300 is fixed in height and slope. Because of the reasons that will be described later, the thermal conduction block 300 should be smaller in specific gravity than the solder 500. Materials for the thermal conduction blocks 300 are selected to meet the above condition. To cope with the utilization of the solder 500, it is preferable to use aluminum alloy for the thermal conduction blocks 300.

Optimum sizes are selected for the recess portions 211 of the heat sink 200 and the thermal conduction blocks 300 respectively in consideration of electric power, sizes and allowable temperature of the LSI devices 120.

According to the present example of the invention described above, the LSI devices 120 are respectively equipped with the thermal conduction blocks 300, whose conic portions 302 are partially stored in the recess portions 211 that are provided in the heat sink 200. Herein, the thermal conduction blocks 300 are capable of operating to follow the heat-radiation surfaces of the LSI devices 120. Thus, it is possible to absorb (or cancel) dispersion in heights and slopes of the LSI devices 120. In addition, it is possible to improve thermal conduction characteristics effected from the LSI devices 120 to the heat sink 200.

Moreover, the thermal conduction blocks 300 and the base portion 210 of the heat sink 200 are connected together using the solder 500 which corresponds to metal having a low melting point. Thus, it is possible to improve thermal conduction characteristics effected from the LSI devices 120 to the heat sink 200.

Next, a description will be given with respect to a method of manufacturing the cooling structure of the multichip module 100 according to the invention with reference to FIG. 2 to FIG. 6. According to this method, heights and slopes of the thermal conduction blocks 300 are made to match with heights and slopes of the LSI devices 120.

Figure 2:
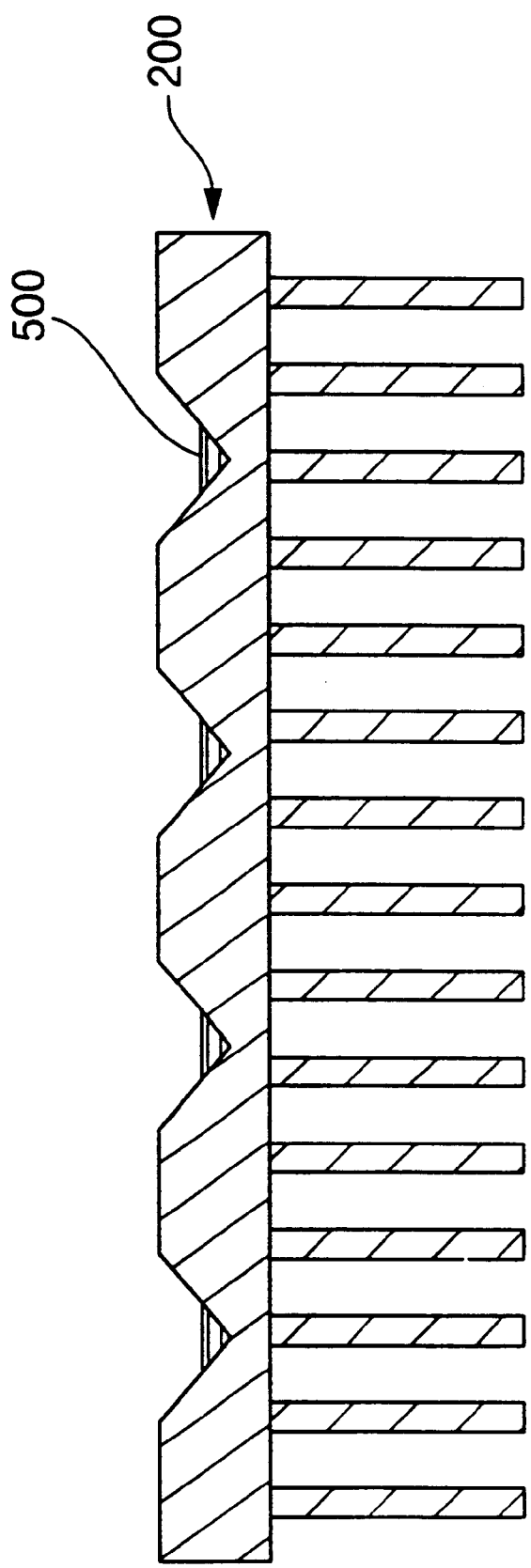
FIG. 2 is a sectional view showing a first step of a method of manufacturing the cooling structure of the multichip module of FIG. 1.

FIG. 2 shows a first step of the method, wherein the heat sink 200 is placed in such a way that the recess portions 211 thereof are turned to the upward, while the solder 500 is provided for each of the recess portions 211. Herein, the solder 500 can be supplied to the recess portions 211 in a melted state, which is established by a dispenser, or the solder 500 can be supplied to the recess portions 211 in a particle-like solid state. An amount of the supplied solder 500 is adjusted in such a way that even when the thermal conduction blocks 300 are partially depressed down into the recess portions 211 up to prescribed positions (which will be described in a next step, see FIG. 3), the melted solder 500 will not overflow but can sufficiently cover the conic portions 302 of the thermal conduction blocks 300.

Figure 3:
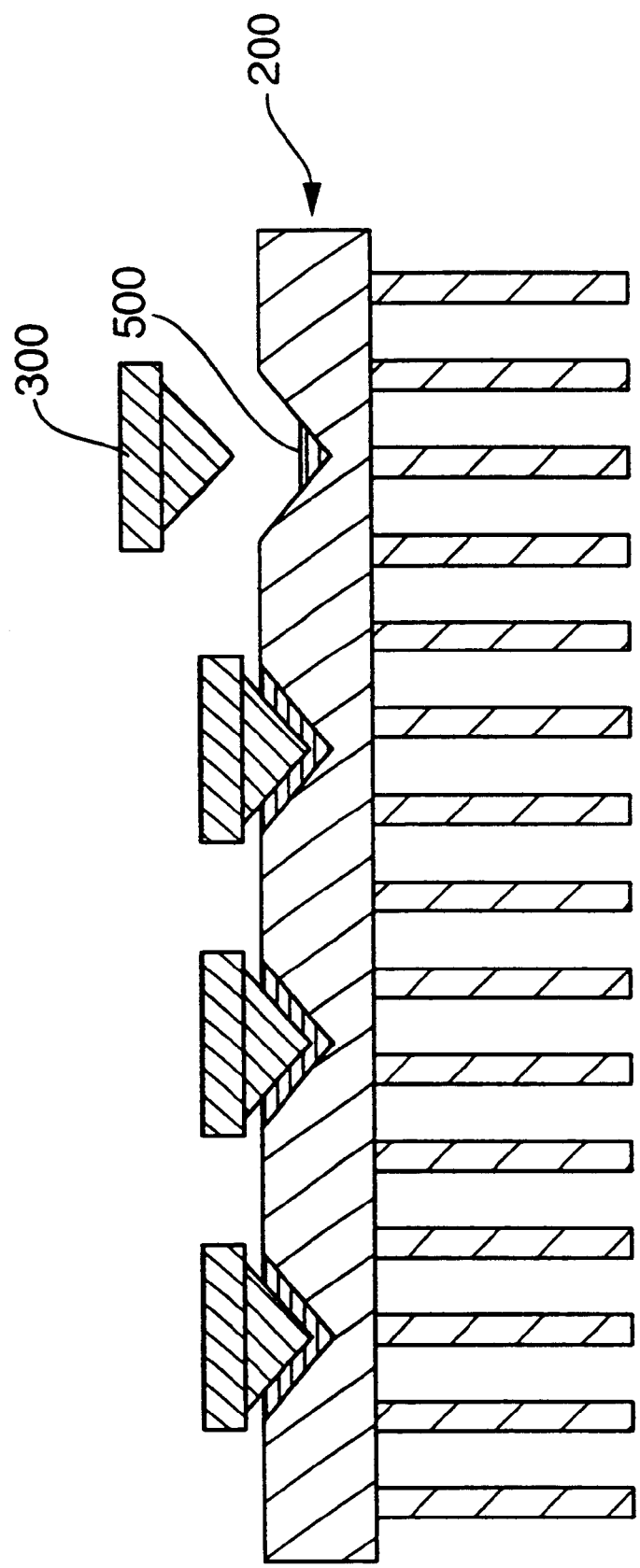
FIG. 3 is a sectional view showing a second step of the method.

FIG. 3 shows a second step of the method, wherein the solder 500 is subjected to melting by a heater (not shown), so the thermal conduction blocks 300 are inserted into the melted and liquidized solder 500 provided in the recess portions 211. As described before, the thermal conduction blocks 300 are smaller in specific gravity than the solder 500. So, the thermal conduction block 300 floats in the melted solder 500. The thermal conduction block 300 is capable of freely moving within the recess portion 211. Hence, it is possible to freely change the height and slope of the thermal conduction block 300 in connection with the heat sink 200.

Figure 4:
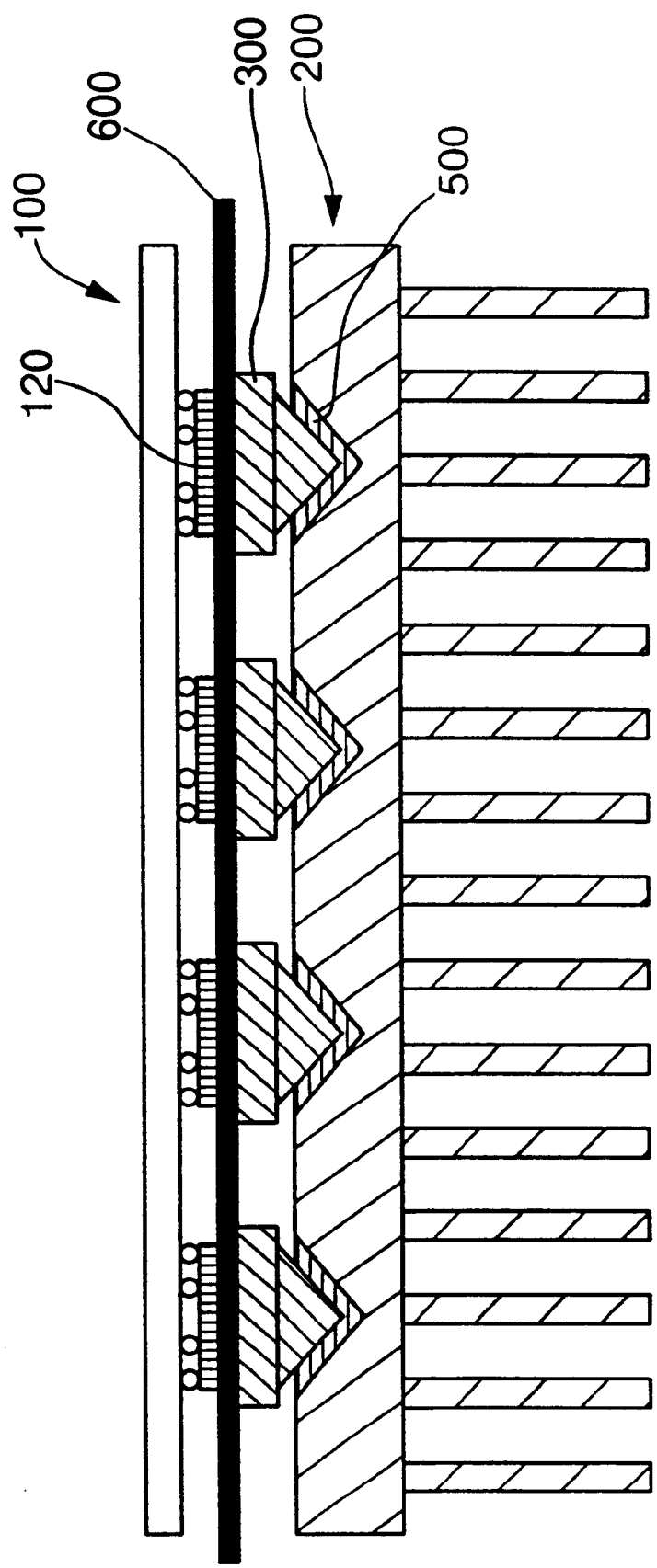
FIG. 4 is a sectional view showing a third step of the method.

FIG. 4 shows a third step of the method, wherein a heat insulating sheet 600 is placed on the thermal conduction blocks 300. In addition, the multichip module 100 is mounted on the heat insulating sheet 600. The multichip module 100 is placed in such a way that the LSI devices 120 face with the heat insulating sheet 600. So, a certain positioning relationship is established in such a way that the LSI devices 120 are respectively located to face with the thermal conduction blocks 300.

The heat insulating sheet 600 is used to avoid direct contact between the LSI devices 120 and the thermal conduction blocks 300. The thermal conduction blocks 300 are heated up to the melting temperature of the solder 500. So, if the thermal conduction blocks 300 come in direct contact with the LSI devices 120, the LSI devices 120 are subjected to thermal damaging or, due to differences of coefficients of thermal expansion between them, the LSI devices 120 are somewhat destroyed. The material for the heat insulating sheet 600 is selected in such a way that the thermal resistance temperature thereof is higher than the melting temperature of the solder 500, thermal conductivity thereof is small, and rigidity thereof is low. Concretely speaking, it is possible to employ polyimide and Teflon. The thickness of the heat insulating sheet 600 is several tens of micro meters or so.

To securely fix the multichip module 100 and the heat sink 200 to each other, there is provided a fixing member (not shown). In the third step, the fixing member is adjusted as well. Due to such an adjustment, the multichip module 100 is fixed to the heat sink 200 with an appropriate interval of distance. Concretely speaking, when the heat insulating sheet 600 is removed so that only the multichip module 100 is mounted on the thermal conduction blocks 300, the adjustment is made such that intervals of distance between the LSI devices 120 of the multichip module 100 and the thermal conduction blocks 300 range between several tens of micro meters and one hundred micro meters.

Figure 5:
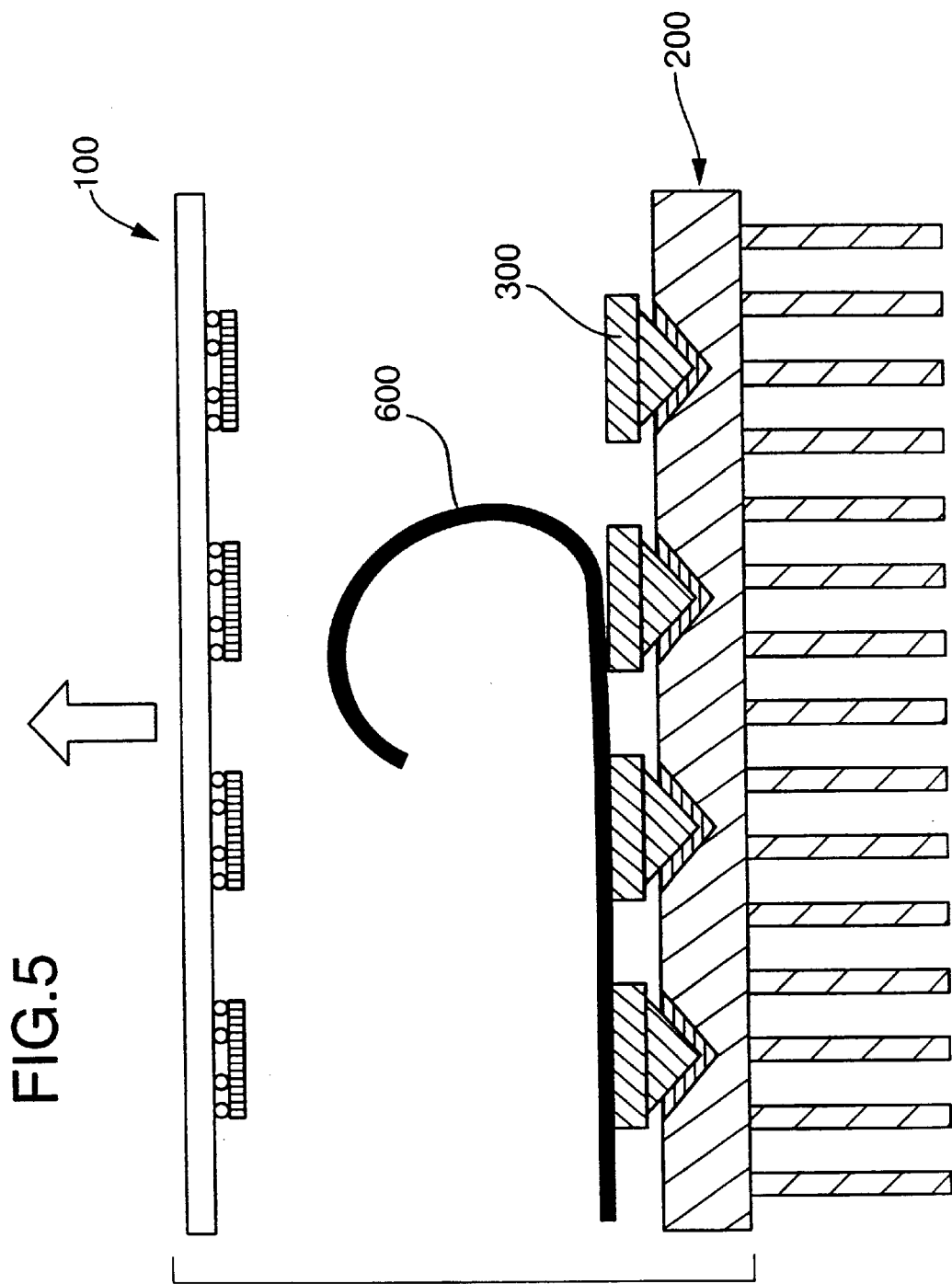
FIG. 5 is a sectional view showing a fourth step of the method.

FIG. 5 shows a fourth step of the method, wherein the heater stops heating while the overall structure of the multichip module is cooled down in order to solidify the solder 500. A cooling time depends on the thermal capacity of the heat sink 200, wherein it is not longer than several minutes. After completion of solidification of the solder 500, the multichip module 100 is removed from the heat insulating sheet 600, then, the heat insulating sheet 600, once placed on the thermal conduction blocks 300, is removed.

Figure 6:
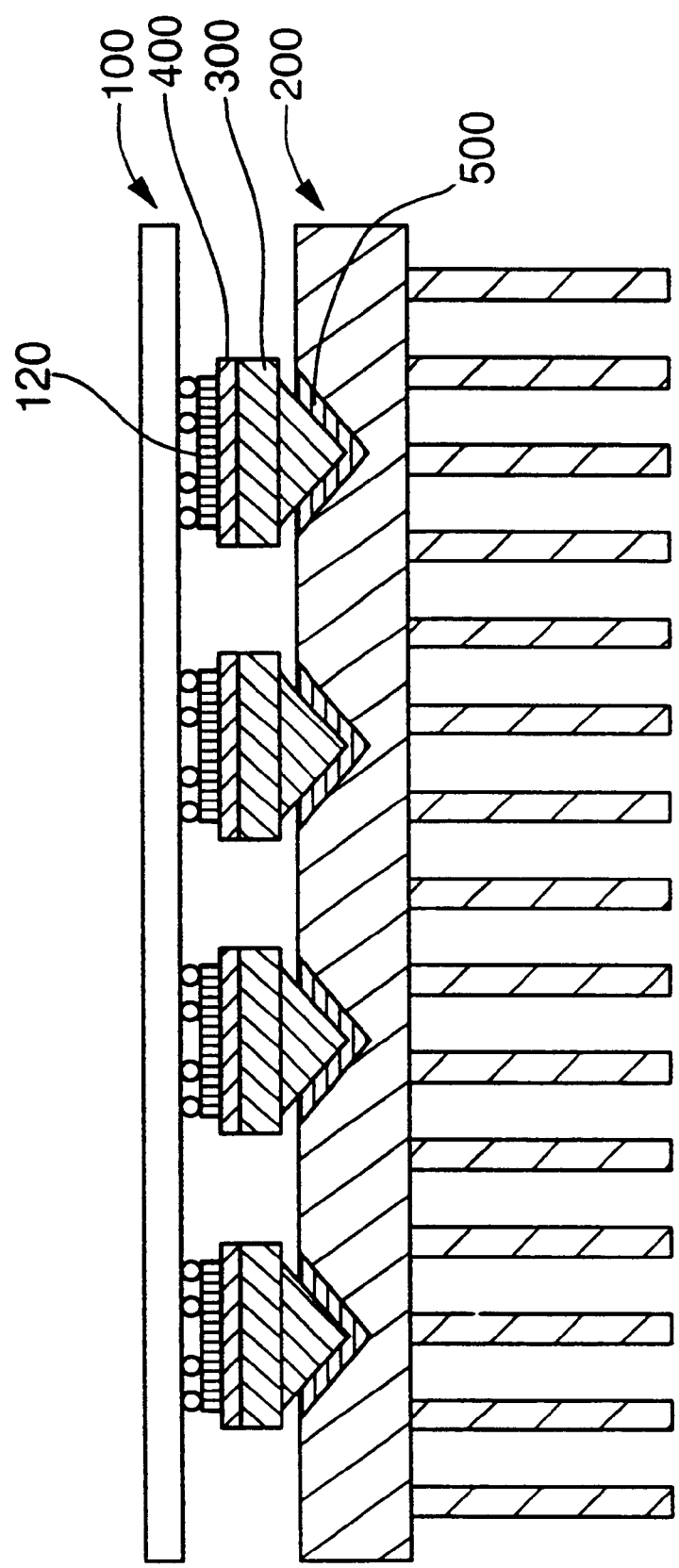
FIG. 6 is a sectional view showing a fifth step of the method.

FIG. 6 shows a fifth step of the method, wherein the multichip module 100 is placed such that the mounting surface thereof, on which the LSI devices 120 are mounted, are turned to the downward. Herein, positioning relationships are established such that positions of the LSI devices 120 correspond to positions of the thermal conduction blocks 300 respectively. In addition, the thermal compounds 400 are provided on the thermal conduction blocks 300 respectively and, the multichip module 100 is mounted on the thermal compounds 400.

According to the present example of the invention described above, the multichip module 100 is placed on the thermal conduction blocks 300, which float in the melted solder 500. Under the state where the thermal conduction blocks 300 follow up the LSI devices 120 with respect to heights and slopes, solidification is made with respect to the solder 500. Thus, it is possible to form a cooling structure of a multichip module in which dispersion in heights and slopes of the LSI devices 120 are canceled.

In addition, the LSI devices 120 of the multichip module 100 are mounted on the thermal conduction blocks 300, which float in the melted solder 500, via the heat insulating sheet 600. This prevents direct transfer of the heat from the thermal conduction blocks 300 to the LSI devices 120. As a result, it is possible to avoid occurrence of failure and destruction of the LSI devices 120.

Next, a second example of the invention will be described with reference to FIG. 7. As compared with the aforementioned first example of FIG. 1, the second example of FIG. 7 is characterized by the shape of the thermal conduction block.

Figure 7:
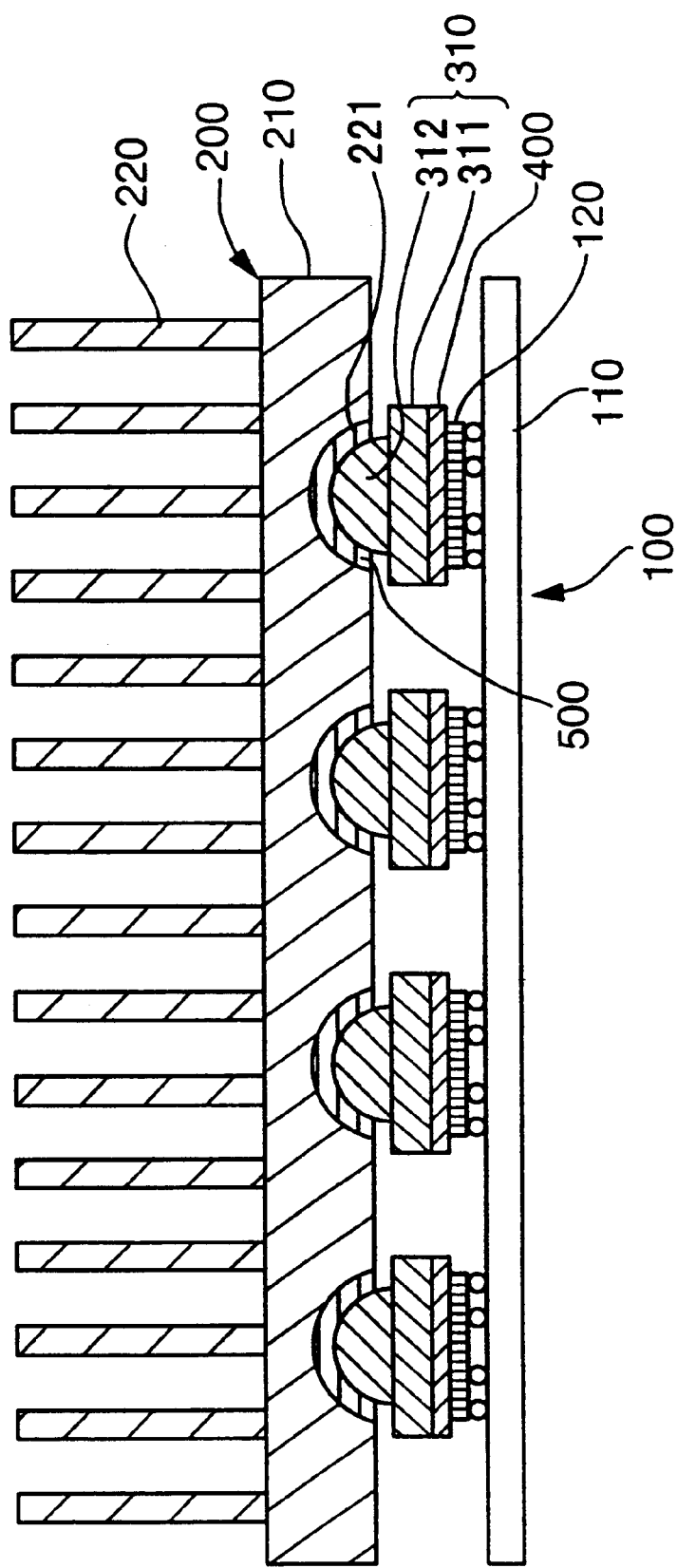
FIG. 7 is a sectional view showing a cooling structure of a multichip module in accordance with a second example of the invention.

In FIG. 7, thermal conduction blocks 310 are provided on upper surfaces of the LSI devices 120. Each of the thermal conduction blocks 310 contains a flat plate portion 311 and a hemisphere portion 312. Because the thermal conduction blocks 300 have the hemisphere portions 312 respectively, interiors of recess portions 211 are formed to have hemispheric surfaces.

As described before, the thermal compound 400 is made of silicon oil mixed with alumina-filler. However, it is possible to mix silver-filler or diamond-filler with the silicon oil.

In the first example of FIG. 1, the thermal conduction block 300 is constructed by two portions, i.e., the flat plate portion 301 and the conic portion 302. However, it is possible to construct the thermal conduction block integrally.

In addition, the conic portion 302 of the thermal conduction block 300 is connected to the recess portion 211 of the heat sink 200 by means of the solder 500. It is possible to use any other metal materials, whose melting point is low, for the solder 500. Herein, however, the metal material for the solder 500 should be smaller in specific gravity than the thermal conduction block. Thus, materials for the low melting point metal and thermal conduction block are appropriately selected to meet the above condition.

As this invention may be embodied in several forms without departing from the spirit of essential characteristics thereof, the present examples of the invention are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A method of manufacturing a cooling structure of a multichip module on which a plurality of integrated circuit devices are mounted, comprising the steps of:

arranging a heat sink having a plurality of recess portions so that a surface of the heat sink at which the plurality of recess portions are formed faces upward;

supplying the plurality of recess portions with low melting point metal material;

melting the low melting point metal material;

inserting at least a part of each of a plurality of thermal conduction blocks into each of the plurality of recess portions of the heat sink via the melted low melting point material;

placing a heat insulating sheet on the plurality of thermal conduction blocks;

placing the multichip module on the heat insulating sheet so that the plurality of integrated circuit devices of the multichip module are located in to correspond with the plurality of thermal conduction blocks;

solidifying the low melting point metal material;

removing the heat insulating sheet;

providing thermal compounds on the plurality of thermal conduction blocks and connecting the integrated circuit devices of the multichip module to the thermal compounds respectively.

2. A method of manufacturing a cooling structure of a multichip module on which a plurality of integrated circuit devices are mounted, comprising the steps of:

arranging a heat sink having a plurality of recess portions so that a surface of the heat sink at which the plurality of recess portions are formed faces upward;

supplying the plurality of recess portions with solder;

heating the solder to be melted within an interior of the plurality of recess portions;

inserting at least a part of each of a plurality of thermal conduction blocks into the interior of each of the plurality of recess portions of the heat sink via the melted solder;

placing a heat insulating sheet on the plurality of thermal conduction blocks;

stopping to heat the solder so that the solder is solidified;

removing the heat insulating sheet;

placing the multichip module on the heat insulating sheet so that the plurality of integrated circuit devices of the multichip module are respectively located to correspond with the plurality of thermal conduction blocks;

adjusting intervals of distance between the integrated circuit devices and the thermal conduction blocks to a prescribed range of distance;

providing thermal compounds on the plurality of thermal conduction blocks respectively; and connecting the integrated circuit devices of the multichip module to the thermal compounds respectively.

3. A method of manufacturing the cooling structure of the multichip module as defined in claim 2 wherein the prescribed range of distance ranges between several tens of micro meters and one hundred micro meters.

* * * * *

UNITED STATES PATENT AND TRADEMARK OFFICE
CERTIFICATE OF CORRECTION

PATENT NO. : 6,251,709 B1  Page 1 of 1
DATED : June 26, 2001
INVENTOR(S) : Minoru Yoshikawa It is certified that error appears in the above-identified patent and that said Letters Patent is hereby corrected as shown below:

<u>Title page,</u>
Insert:

-- [30]     Foreign Application Priority Data

June 30, 1997     (JP) . . . . . . . . . . . . . . . . . . . 9-174143 --

Signed and Sealed this

Sixth Day of May, 2003

JAMES E. ROGAN
*Director of the United States Patent and Trademark Office*